(12) United States Patent
Lee et al.

(10) Patent No.: US 12,161,026 B2
(45) Date of Patent: Dec. 3, 2024

(54) MULTI-FUNCTIONAL AMBIENT LIGHT SENSOR PACKAGING

(71) Applicant: Synaptics Incorporated, San Jose, CA (US)

(72) Inventors: Albert Y. Lee, San Jose, CA (US); Qing Xiao, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 18/531,170

(22) Filed: Dec. 6, 2023

(65) Prior Publication Data

US 2024/0107828 A1     Mar. 28, 2024

Related U.S. Application Data

(63) Continuation of application No. 18/169,201, filed on Feb. 14, 2023, now Pat. No. 11,903,269.

(60) Provisional application No. 63/339,946, filed on May 9, 2022.

(51) Int. Cl.
*H10K 59/13* (2023.01)
*G01D 5/14* (2006.01)
*G01J 1/42* (2006.01)
*G06F 3/041* (2006.01)
*G06F 3/044* (2006.01)
*H10K 59/40* (2023.01)
*H10K 59/80* (2023.01)

(52) U.S. Cl.
CPC .............. *H10K 59/13* (2023.02); *G01D 5/145* (2013.01); *G01J 1/4204* (2013.01); *G06F 3/0416* (2013.01); *G06F 3/044* (2013.01); *H10K 59/40* (2023.02); *H10K 59/8794* (2023.02)

(58) Field of Classification Search
None
See application file for complete search history.

(56) References Cited

U.S. PATENT DOCUMENTS

2022/0019315 A1*   1/2022   Gray ................... G06F 3/0416

\* cited by examiner

*Primary Examiner* — Stephen T. Reed
(74) *Attorney, Agent, or Firm* — Leydig, Voit & Mayer, Ltd.

(57) ABSTRACT

A touchscreen display device includes: a display; a flexible printed circuit; touch sensing electrodes connected to the flexible printed circuit; and a multi-functional ambient light sensor package mounted on the flexible printed circuit. The multi-functional ambient light sensor package includes: an ambient light sensor; transmitter and receiver circuitry connected to the touch sensing electrodes via the flexible printed circuit; and a controller configured to obtain capacitance information from the touch sensing electrodes and ambient light information from the ambient light sensor via a single chip. The multi-functional ambient light sensor package may be packaged as a wafer-level chip-scale package (WLCSP).

14 Claims, 17 Drawing Sheets

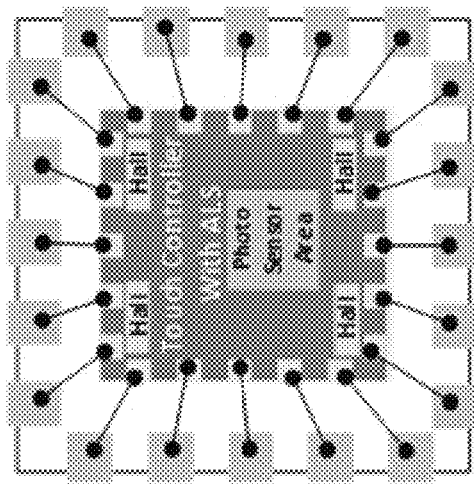
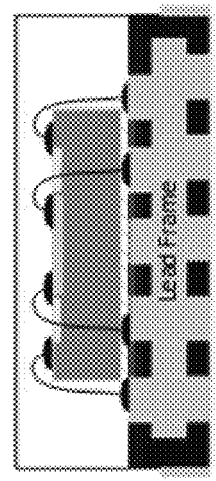
FIG. 7C
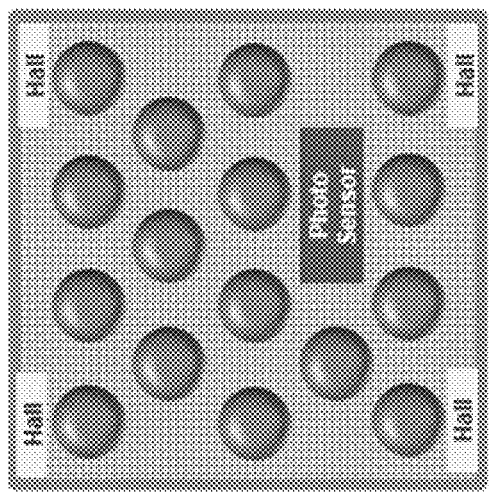
FIG. 7B
FIG. 7A

MULTI-FUNCTIONAL AMBIENT LIGHT SENSOR PACKAGING

CROSS-REFERENCE TO RELATED APPLICATIONS

This application is a continuation of copending U.S. patent application Ser. No. 18/169,201, filed Feb. 14, 2023, which claims the benefit of U.S. Provisional Patent Application No. 63/339,946, filed on May 9, 2022. The aforementioned patent applications are hereby incorporated by reference in their entireties.

TECHNICAL FIELD

The described embodiments relate generally to electronic devices, and more specifically, to multi-functional packages which include an ambient light sensor (ALS).

BACKGROUND

Input devices, including capacitive sensor devices (e.g., touchpads or touch sensor devices), are widely used in a variety of electronic systems. A capacitive sensor device may include a sensing region, often demarked by a surface, in which the capacitive sensor device determines the presence, location and/or motion of one or more input objects. Capacitive sensor devices may be used to provide interfaces for the electronic system. For example, capacitive sensor devices may be used as input devices for larger computing systems (e.g., opaque touchpads integrated in, or peripheral to, notebook or desktop computers). Capacitive sensor devices are also often used in smaller computing systems (e.g., touchscreens integrated in cellular phones). Capacitive sensor devices may also be used to detect input objects (e.g., finger, styli, pens, fingerprints, etc.).

Computing systems and input devices which utilize a capacitive sensor often also include an ALS. In conventional systems and devices, the ALS and the touch controller are separately packaged, and the ALS is packaged using a specialized optical package, such as a lead frame-based package (e.g., of an optical dual flat no-lead (ODFN) type or an optical quad flat no-lead (OQFN) type) or a substrate-based package (e.g., of an optical land grid array (OLGA) type or a through silicon via (TSV)-based ball grid array (BGA) package type). The ALS may be a semiconductor-based ALS used to detect a level of ambient light, and the detected level of ambient light can be used to set a brightness level of the display assembly within a portable or wearable device. For example, in a darker environment with little ambient light, the readings from ALS can cause the processor in a portable or wearable device to dim the display assembly, and in a brighter ambient environment, the display assembly can be made brighter.

SUMMARY

In an exemplary embodiment, the present disclosure provides a touchscreen display device. The touchscreen display device includes: a display; a flexible printed circuit; touch sensing electrodes connected to the flexible printed circuit; and a multi-functional ambient light sensor package mounted on the flexible printed circuit. The multi-functional ambient light sensor package includes: an ambient light sensor; transmitter and receiver circuitry connected to the touch sensing electrodes via the flexible printed circuit; and a controller configured to obtain capacitance information from the touch sensing electrodes and ambient light information from the ambient light sensor via a single chip.

In a further exemplary embodiment, the flexible printed circuit comprises a cutout, and wherein the ambient light sensor is configured to detect ambient light that has passed through the cutout.

In a further exemplary embodiment, the display comprises an aperture aligned with the cutout, and wherein the ambient light detected by the ambient light sensor passes through the aperture of the display before passing through the cutout of the flexible printed circuit.

In a further exemplary embodiment, the display is offset from the cutout, and wherein the touchscreen display device further comprises a spacer offset from the display.

In a further exemplary embodiment, the transmitter and receiver circuitry is further connected to an inductor, and wherein the controller of the multi-functional ambient light sensor package is further configured to obtain inductance information for inductive sensing.

In a further exemplary embodiment, the multi-functional ambient light sensor package is packaged as a wafer-level chip-scale package (WLCSP).

In a further exemplary embodiment, the touchscreen display device further includes heatsink material disposed between the display and the flexible printed circuit.

In another exemplary embodiment, the present disclosure provides a computing device system. The computing device system includes: an antenna; a printed circuit board; and a multi-functional ambient light sensor package mounted on the printed circuit board. The multi-functional ambient light sensor package includes: an ambient light sensor; a closure sensor; and a controller configured to obtain capacitance information from the antenna for specific absorption rate (SAR) proximity sensing, closure information from the closure sensor, and ambient light information from the ambient light sensor via a single chip.

In a further exemplary embodiment, the multi-functional ambient light sensor package is packaged as a wafer-level chip-scale package (WLCSP).

In a further exemplary embodiment, the multi-functional ambient light sensor package is packaged as an optical quad flat no-lead (OQFN) package, an optical dual flat no-lead (ODFN) package, or an optical land grid array (OLGA) package.

In a further exemplary embodiment, the printed circuit board comprises a cutout aligned with the ambient light sensor of the multi-functional ambient light sensor package, and the ambient light sensor is configured to detect ambient light that has passed through the cutout.

In a further exemplary embodiment, the computing device system further includes a microphone, a camera, and/or a second controller, wherein the microphone, the camera, and/or the second control are disposed on the printed circuit board and/or one or more other printed circuit boards.

In a further exemplary embodiment, the antenna is a laser direct structuring (LDS) antenna, a flexible printed circuit (FPC) antenna, a PCB antenna, or a discrete wire antenna.

In a further exemplary embodiment, the computing device system is part of a laptop, and the antenna, the printed circuit board, and the multi-functional ambient light sensor package are disposed in a top area of a bezel of a lid of the laptop.

In a further exemplary embodiment, the computing device system is part of a tablet, and the antenna, the printed circuit board, and the multi-functional ambient light sensor package are disposed in a top area of a bezel of the tablet.

In yet another exemplary embodiment, the present disclosure provides a multi-functional ambient light sensor package. The multi-functional ambient light sensor package includes: an ambient light sensor; transmitter and receiver circuitry connected to one or more electrodes; and a controller configured to obtain capacitance information from the one or more electrodes and ambient light information from the ambient light sensor via a single chip.

In a further exemplary embodiment, the multi-functional ambient light sensor package further includes a closure sensor, the controller is further configured to obtain closure information via the closure sensor, and the closure sensor is a Hall sensor or an inductive sensor.

In a further exemplary embodiment, the transmitter and receiver circuitry is further connected to an inductor, and the controller of the multi-functional ambient light sensor package is further configured to obtain inductance information for inductive sensing.

In a further exemplary embodiment, the multi-functional ambient light sensor package is packaged as a wafer-level chip-scale package (WLCSP).

In a further exemplary embodiment, the multi-functional ambient light sensor package is packaged as an optical quad flat no-lead (OQFN) package, an optical dual flat no-lead (ODFN) package, or an optical land grid array (OLGA) package.

BRIEF DESCRIPTION OF DRAWINGS

FIGS. 7A-7B depict an example of a 3-in-1 multi-functional WLCSP touch controller having SAR sensing capabilities, ambient light sensing capabilities, and Hall sensing capabilities.

FIG. 7C depicts an example of a 3-in-1 multi-functional OQFN touch controller having SAR sensing capabilities, ambient light sensing capabilities, and Hall sensing capabilities.

DETAILED DESCRIPTION

Figure 1:
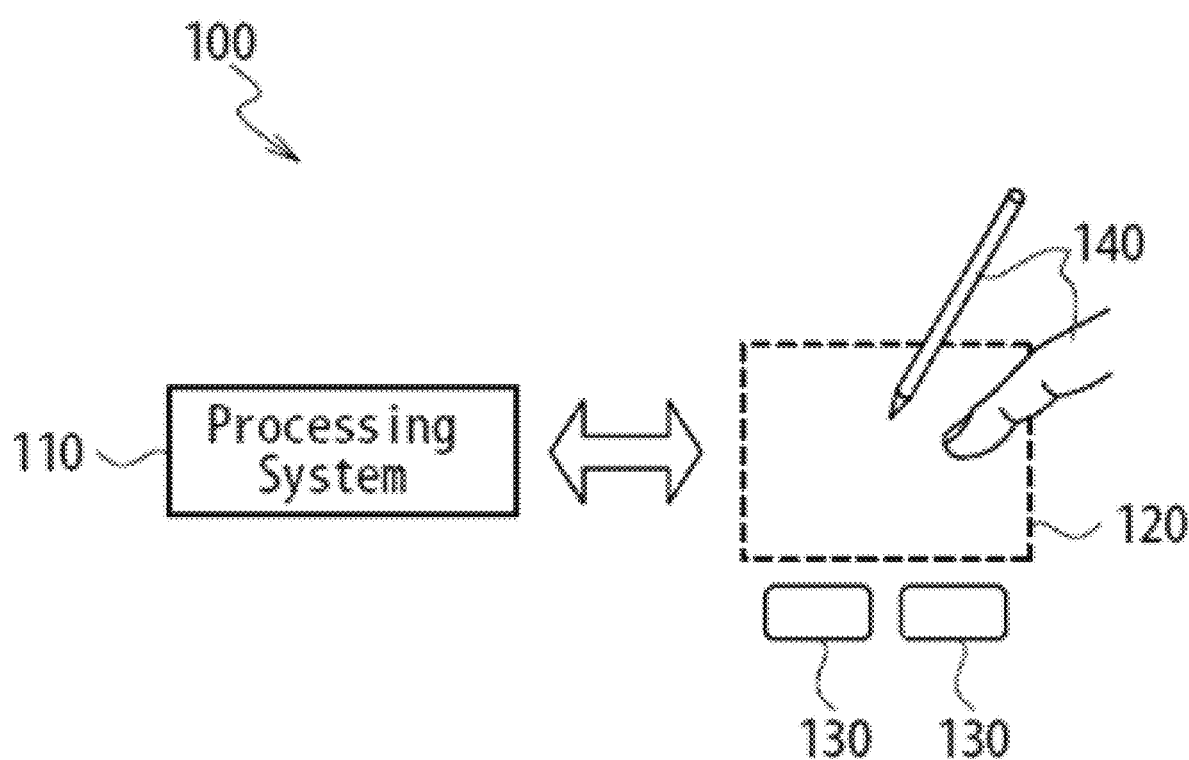
FIG. 1 depicts a schematic block diagram of an exemplary input device.

The drawings and the following detailed description are merely exemplary in nature, and are not intended to limit the disclosed technology or the application and uses of the disclosed technology. Furthermore, there is no intention to be bound by any expressed or implied theory presented in the preceding technical field, background, or the following detailed description.

In the following detailed description of exemplary embodiments, numerous details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

The following description of sensor patterns relies on terminology such as "horizontal", "vertical", "top", "bottom", and "under" to clearly describe certain geometric features of the sensor patterns. The use of these terms is not intended to introduce a limiting directionality. For example, the geometric features may be rotated to any degree, without departing from the disclosure. Further, while patterns of certain sizes are shown in the drawings, the patterns may extend and/or repeat without departing from the disclosure. For example, the use of the term columns and vertical direction is to distinguish between rows and the horizontal direction, respectively. If the input device is rectangular, any direction along the surface may be designated as the vertical direction by which a column extends and any substantially orthogonal direction along the surface may be designated as a vertical direction along which the row extends.

As discussed above, in conventional input devices and computing systems, ALSs are packaged on their own, typically using specialized optical packages. However, in many computing environments, for example with respect to wearable electronic devices, laptops, tablets, or smartphones, the amount of available space is constrained. Exemplary embodiments of the disclosure provide various multi-functional ALS packages in which an ALS is integrated together with one or more other components in an advantageous manner that achieves space savings, as well as cost savings.

An example input device 100 is shown in FIG. 1 to provide an example environment to explain working principles of a capacitive sensor in connection with a processing system. The input device 100 may be configured to provide input to an electronic system. As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system, or can be physically separate from the electronic system. In one embodiment, the electronic system may be referred to as a host device. As appropriate, the input device 100 may communicate with parts of the electronic system using any one or more of the following: buses, networks, and other wired or wireless interconnections. Examples include I2C, SPI, PS/2, Universal Serial Bus (USB), Bluetooth, RF, and IRDA.

In FIG. 1, the input device 100 is shown as a capacitive sensor device configured to sense input provided by one or more input objects 140 in a sensing region 120. Example input objects 140 include fingers and styli, as shown in FIG. 1. An exemplary capacitive sensor device may be a touchpad, a touchscreen, a touch sensor device and the like.

Sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises: no contact with any surfaces of the input device 100; contact with an input surface, e.g., a touch surface, of the input device 100; contact with an input surface of the input device 100 coupled with some amount of applied force or pressure; and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may utilize capacitive sensing, and may further utilize elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object (e.g., between a system ground and freespace coupling to the user). In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to reduce or minimize visible transmission loss from the display subpixels). Further, the sensor electrodes may be disposed over a display of a display device. The sensing electrodes may be formed on a common substrate of a display device (e.g., on the encapsulation layer of a rigid or flexible organic light emitting diode (OLED) display). An additional dielectric layer with vias for a jumper layer may also be formed of a substantially transparent metal mesh material (e.g., between the user input and the cathode electrode). Alternately, the sensor may be patterned on a single layer of metal mesh over the display active area with cross-overs outside of the active area. The jumpers of the jumper layer may be coupled to the electrodes of a first group and cross over sensor electrodes of a second group. In one or more embodiments, the first and second groups may be orthogonal axes to each other. Further, in various embodiments, the absolute capacitance measurement may comprise a profile of the input object couplings accumulated along one axis and projected onto the other. In various embodiments, a modulated input object (e.g., a powered active stylus) may be received by the orthogonal electrode axes without modulation of the corresponding electrodes (e.g., relative to a system ground). In such an embodiment, both axes may be sensed simultaneously and combined to estimate stylus position.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transmitter signals. Receiver sensor electrodes may be held substantially constant relative to the reference voltage or modulated relative to the transmitter sensor electrodes to facilitate receipt of resulting signals. A resulting signal may comprise effect(s) corresponding to one or more transmitter signals, and/or to one or more sources of environmental interference, e.g., other electromagnetic signals. Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) chips and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor (e.g., a mobile device application processor or any other central processing unit) of the phone. In some embodiments, the processing system 110 is dedicated to implementing the input device 100. In other embodiments, the processing system 110 also performs other user input functions, such as operating display screens, measuring input forces, measuring tactile switch state, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as graphical user interface (GUI) actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. The filtering may comprise one or more of demodulating, sampling, weighting, and accumulating of analog or digitally converted signals (e.g., for finite impulse response (FIR) digital or infinite impulse response (IIR) switched capacitor filtering) at appropriate sensing times. The sensing times may be relative to the display output periods (e.g., display line update periods or blanking periods). As yet another example, the processing system 110 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, unused sensor electrodes, and or any proximate conductive object. Additionally, the baseline may be compensated for using digital or analog means. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touchscreen interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may comprise substantially transparent sensor electrodes (e.g., ITO, metal mesh, etc.) overlaying the display screen and provide a touchscreen interface for the associated electronic system. The display panel may be any type of dynamic display capable of displaying a visual interface to a user, and may include any type of light emitting diode (LED), OLED, cathode ray tube (CRT), liquid crystal display (LCD), plasma, electroluminescence (EL), or other display technology. The input device 100 and the display panel may share physical elements. For example, some embodiments may utilize some of the same electrical components for displaying and sensing. As another example, the display panel may be operated in part or in total by the processing system 110.

A cathode electrode of an OLED display may provide a low impedance screen between one or more display electrodes and the sensor electrodes which may be separated by a thin encapsulation layer. For example, the encapsulation layer may be about 10 um. Alternatively, the encapsulation layer may be less than 10 um or greater than 10 um. Further, the encapsulation layer may be comprised of a pin hole free stack of conformal organic and inorganic dielectric layers.

It should be understood that while many embodiments of the disclosure are described in the context of a fully functioning apparatus, the mechanisms of the disclosure are capable of being distributed as a program product, e.g., software, in a variety of forms. For example, the mechanisms of the disclosure may be implemented and distributed as a software program on information bearing media that are readable by electronic processors, e.g., non-transitory computer-readable and/or recordable/writable information bearing media readable by the processing system 110. Additionally, the embodiments of the disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
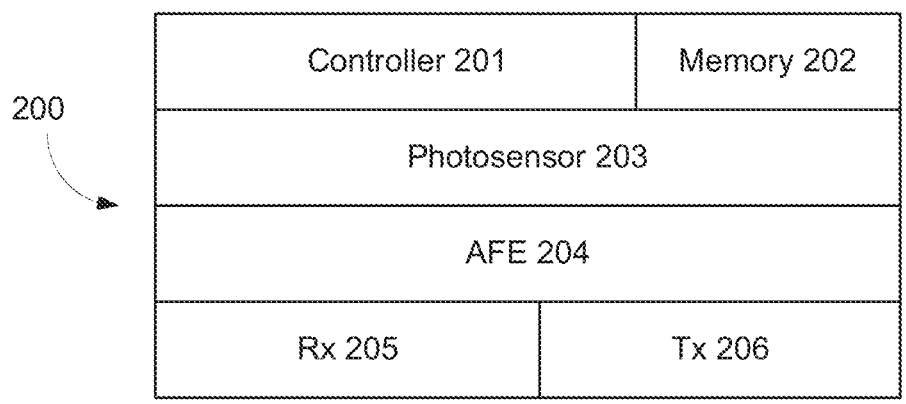
FIG. 2A depicts a device functional level block diagram of a wafer-level chip-scale package (WLCSP) touch controller having an integrated ALS according to an exemplary embodiment.
Figure 2B:
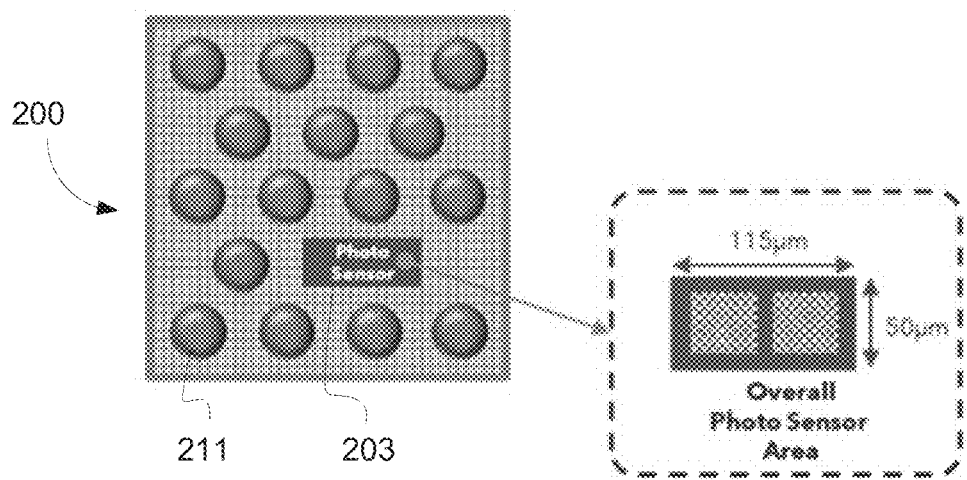
FIG. 2B depicts a bottom view of the WLCSP touch controller having the integrated ALS shown in FIG. 2A.
Figure 2C:
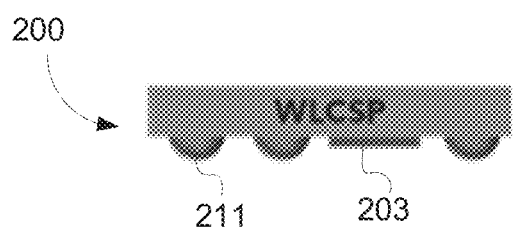
FIG. 2C depicts a side, cross-sectional view of the WLCSP touch controller having the integrated ALS shown in FIG. 2A.

FIGS. 2A-2C depict an exemplary multi-functional ALS package 200 in which an ALS is integrated with a touch controller on a single die (e.g., a silicon die) in a wafer-level chip-scale package (WLCSP). The WLCSP depicted in FIGS. 2A-2C is usable in connection with a display device to provide both: (1) behind-display ALS functionality for a touchscreen display device, such as a wearable device or a smartphone; and (2) touch control functionality with respect to the touchscreen display device's touch sensing capabilities. It will be appreciated that a WLCSP package is a class of semiconductor package that is based on the die level package, as opposed to other packages that encapsulate the die with a mold compound (e.g., LQFP, QFN, BGA). A WLCSP generally has a relatively small outline since it is based on the die, and the WLCSP is processed based on a wafer level process (e.g., RDL—redistribution layer plus solder balls).

Figure 2E:
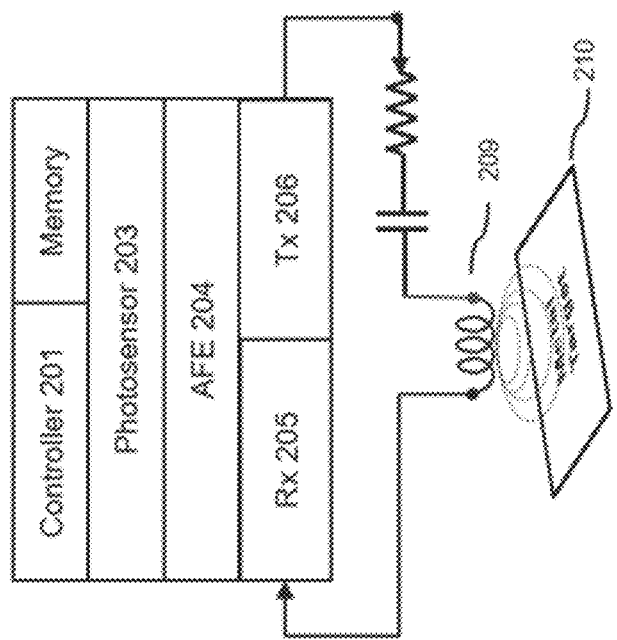
FIG. 2E depicts the WLCSP touch controller of FIG. 2A being used for inductive sensing.
Figure 2D:
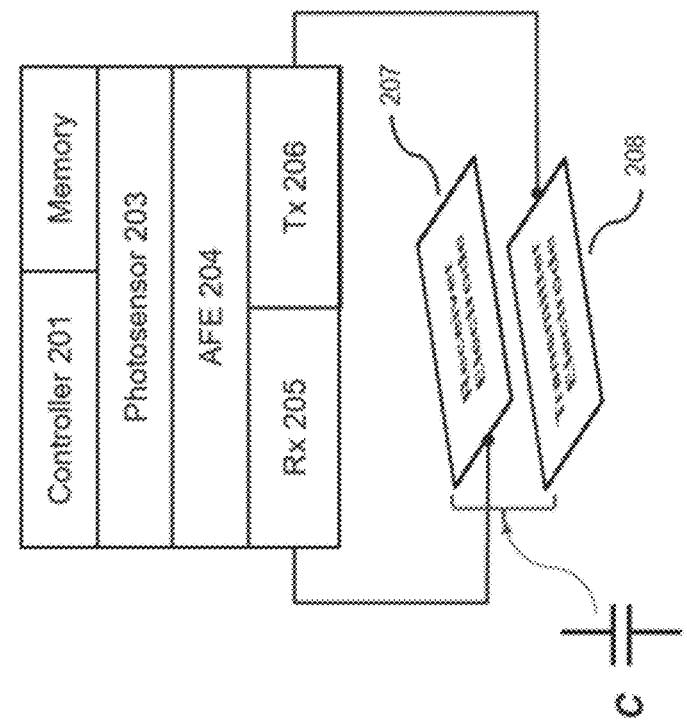
FIG. 2D depicts the WLCSP touch controller of FIG. 2A being used for capacitive sensing.

FIG. 2A depicts a device functional level block diagram of a WLCSP touch controller having an integrated ALS according to an exemplary embodiment. The block diagrams includes controller 201, which can be based on any number of microcontrollers architectures (e.g., ARM, RISC V, 8051) and/or an array logic that provides overall control of the device. Memory 202 provides storage for the controller firmware and storage for controller data calculations. The photosensor 203 is a light sensitive semiconductor device that may be based on a diode, a transistor and or array of either diodes or transistors. An analog front end (AFE) 204 provides the conversion of an analog signal to digital signal. The analog signals can be from external sensors (such as capacitive sensing electrodes as shown in FIG. 2D or an inductive-based sensor as shown in FIG. 2E). The conversion from an analog signal to digital signal is typically accomplished by ADC (analog-to-digital conversion) with some level of signal processing and filtering. Tx 206 comprises transmitter circuitry for outputting stimulus signals for one or more transmitters, and Rx 205 comprises receiver circuitry for obtaining resulting signals corresponding to the stimulus signals. For example, in accordance with FIG. 2D, Rx 205 and Tx 206 may be connected to one or more receiver electrodes 207 and one or more transmitter electrodes 208, respectively, for transcapacitive sensing. In another example, in accordance with FIG. 2E, Rx 205 and Tx 206 may be connected to an inductor 209 for inductive sensing with respect to a metal target 210. It will further be appreciated that in another example, Rx 205 and Tx 206 may include multiple Rx and Tx channels, such that multi-functional ALS package 200 is capable of performing both transcapacitive sensing and inductive sensing (in addition to ambient light sensing as discussed below in connection with FIGS. 2B-2C). It will be appreciated that, unless contradicted by context or expressly precluded, "connected" (or "coupled") includes both direct and indirect connections or couplings.

FIG. 2B depicts a bottom view of the WLCSP touch controller having the integrated ALS shown in FIG. 2A, and FIG. 2C depicts a side, cross-sectional view of the WLCSP touch controller having the integrated ALS shown in FIG. 2A. As shown in FIGS. 2B and 2C, there are a plurality of solder balls 211 attached to the bottom of the WLCSP touch controller for connecting various components of the WLCSP touch controller to a flexible printed circuit (FPC). Additionally, photosensor 203 is disposed on the bottom of the WLCSP touch controller and is positioned such that the photosensor 203 does not overlap with redistribution layer (RDL) routing of the WLCSP and ball grid array (BGA) balls of the WLCSP. In this example, the photosensor 203 has an overall length of 115 µm and an overall width of 50 µm and includes two individual photosensors (e.g., diode or transistor devices or arrays thereof) corresponding to the two squares depicted in the photosensor area. It will be appreciated, however, that the location and dimensions of the photosensor 203 shown in FIG. 2B are merely exemplary, and that the photosensor 203 may be disposed in a different location and/or have different dimensions without departing from the principles discussed herein.

A protective coating and/or an oxidation coating may be provided over the top of a die where the photosensor 203 is located. For example, an optically clear polyimide (PI) coating may be used to protect the exposed photosensor from damage during assembly onto a printed circuit board (PCB) or FPC. Additionally, an infrared optical cut-off filter over the photo sensor for mimicking a human visual response.

It will be appreciated that the configurations shown in FIGS. 2A-2E are merely examples, and that the components depicted therein may be arranged in different locations without departing from the principles discussed herein.

Figure 3A:
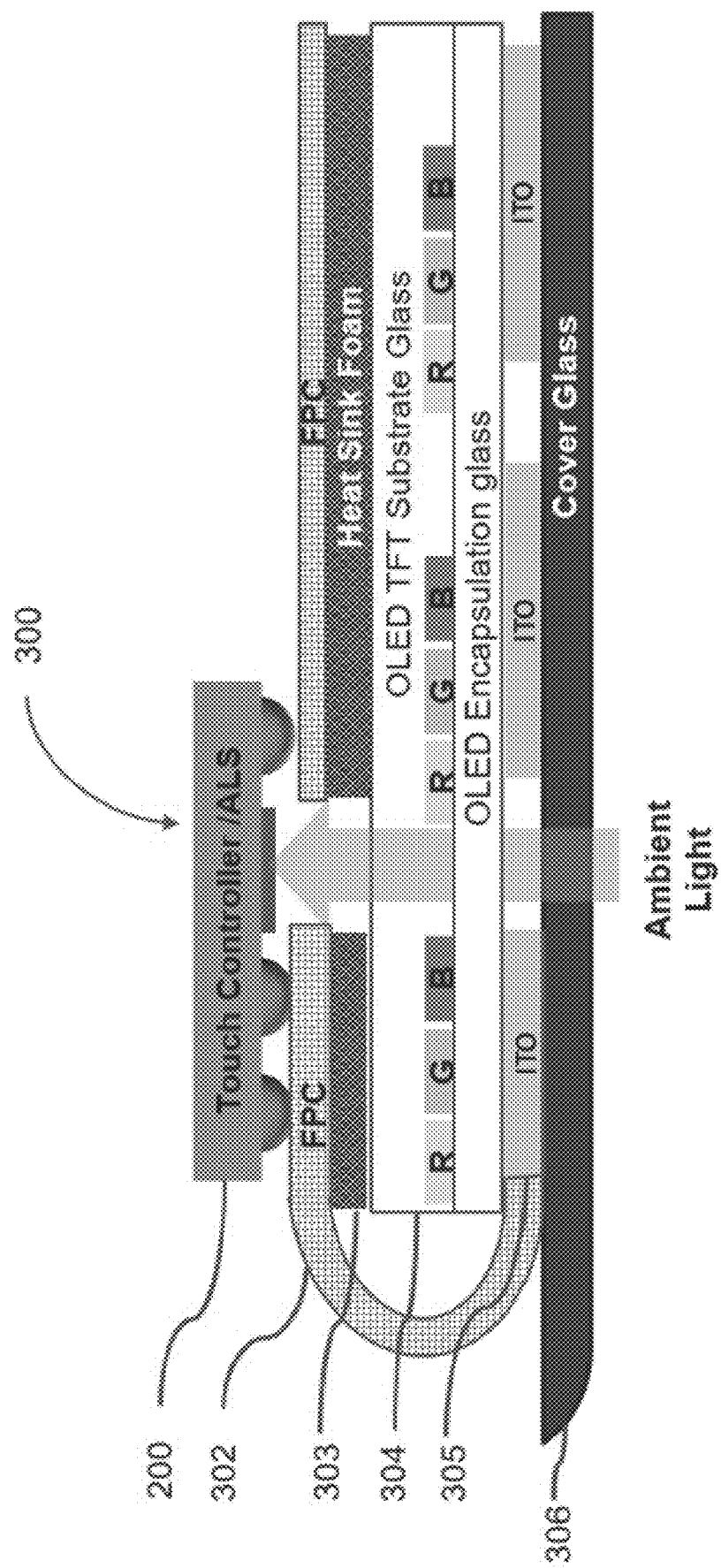
FIG. 3A depicts a cross-sectional view of an exemplary wearable device according to an exemplary embodiment.

FIG. 3A depicts a cross-sectional view of an exemplary wearable device 300 (e.g., an activity band to be worn on a user's wrist) which includes an exemplary implementation of the multi-functional ALS package 200 of FIGS. 2A-2C. FIG. 3A further depicts an FPC 302, a heatsink foam layer 303, a display 304, an indium tin oxide (ITO) layer 305, and a cover glass 306. The multi-functional ALS package 200, which is a WLCSP touch controller having an integrated ALS, is mounted on the FPC 302, and the FPC is separated from the display 304 by the heatsink foam layer 303.

FPC 302 provides an interconnect media between the touch controller (the multi-functional ALS package 200) and the touchscreen layer (which may comprise clear ITO electrodes of ITO layer 305 deposited on the OLED encapsulation glass of the display 304). FPC 302 in some cases may also provide the interconnect to a display driver IC. Heatsink foam layer 303 is as a heat dissipation layer for dissipating heat that is generated from operation of the OLED display. In the case of a glass-based OLED module, a foam material may be used both as a heatsink and for shock absorption to prevent damage to the glass OLED. In the case of a flexible OLED, a copper foil layer may be used for heat dissipation for heat generated by the plastic OLED module. As can be seen from FIG. 3A, for realization of the ALS function of the multi-functional ALS package 200 positioned behind the display 304, the overall wearable device 300 is configured to provide a field of view (FOV) for the ALS to allow the ALS to detect ambient light.

It will be appreciated that the display 304 in FIG. 3A is a glass substrate-based OLED display. For glass substrate-based OLED display modules, the touchscreen layer is typically implemented through a layer of optically clear ITO commonly deposited on top of the top encapsulation glass. Connection from the touch controller to this array of ITO electrodes is accomplished by attaching a FPC via conductive adhesive known as Anisotropic Conductive Adhesives (ACA). In another exemplary embodiment, for a flexible plastic-based substrate OLED, the stack up may be very similar with glass substrate with a few material differences (e.g., the heatsink layer may be a copper foil layer, and the OLED display may be flexible instead of glass, and the touch electrodes may be implemented as a metal mesh touchscreen layer).

The display 304 may be, for example, an organic light-emitting diode (OLED) display device (e.g., a passive-matrix OLED (PMOLED) or an active-matrix (AMOLED) display device), and as discussed above, the display 304 may be based on either a glass or plastic substrate. For AMOLEDs, the display substrates that are commonly in use can be glass or a plastic substrate based on a polyimide material. As shown in FIG. 3A, components of the display 304 are positioned such that a clear area (i.e., an aperture) is provided through the display 304. This clear area is aligned with a field of view of the photosensor of the multi-functional ALS package 200 and respective cutouts of the FPC 302 and the heatsink foam layer 303.

Figure 3B:
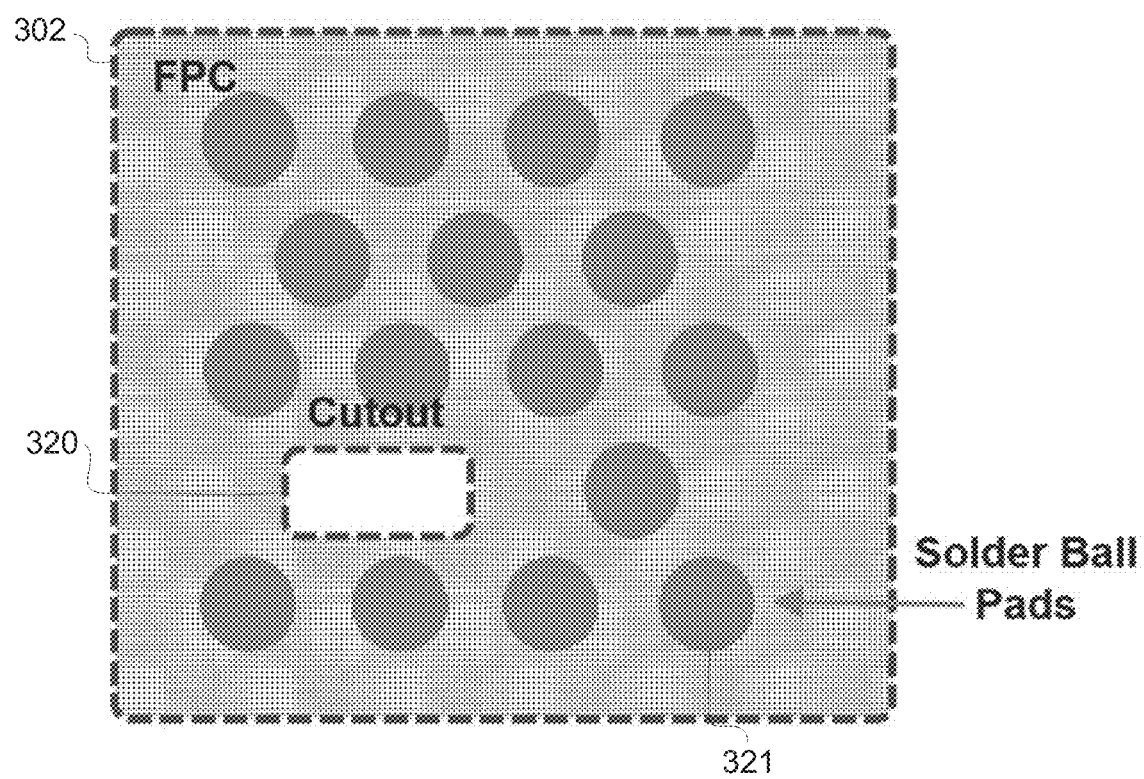
FIG. 3B depicts a bottom-up view of the FPC of FIG. 3A.

FIG. 3B depicts a bottom-up view of the FPC 302 depicted in FIG. 3A. The FPC 302 includes solder pads 321 (for attachment to corresponding solder balls of the multi-functional ALS package 200) and a cutout 320 to allow for ambient light to pass through the FPC 302. The size and location of the cutout 320 is aligned to the FOV of the ALS of the multi-functional ALS package 200 and allows for an appropriate amount of ambient light (e.g., at least an amount of light exceeding a minimum brightness detection level of the ALS) to pass through to the photosensor 203 on the die of the multi-functional ALS package 200. Additionally, the size and location of the cutout 320 avoids violating any design rules for pitch and/or distance with respect to adjacent solder ball pads and/or FPC vias. In an example, the cutout 320 may have a length of 120 µm and an overall width of 60 µm (based on the photosensor 203 having an overall length of 115 µm and an overall width of 50 µm). It will be appreciated, however, that the location and dimensions of the cutout 320 shown in FIG. 3B are merely exemplary, and that the cutout 320 may be disposed in a different location and/or have different dimensions based on the position and the size of a corresponding photosensor. It will be appreciated that the cutout in the heatsink foam layer 303 may be aligned with and may have a similar size to the cutout 320 of the FPC 302.

Figure 3D:
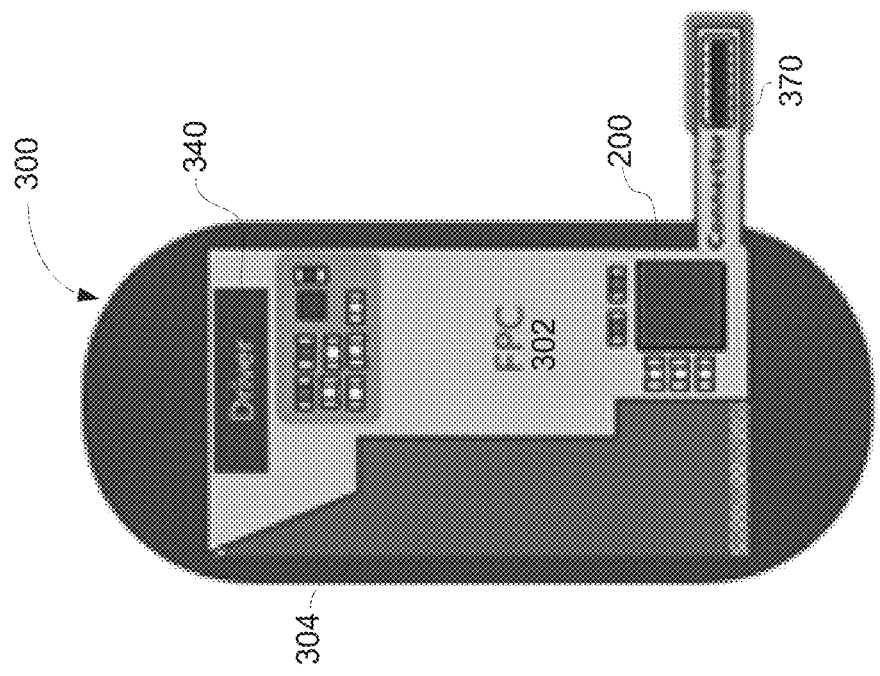
FIG. 3D depicts a bottom-up view of internal components of the wearable device of FIG. 3A.
Figure 3C:
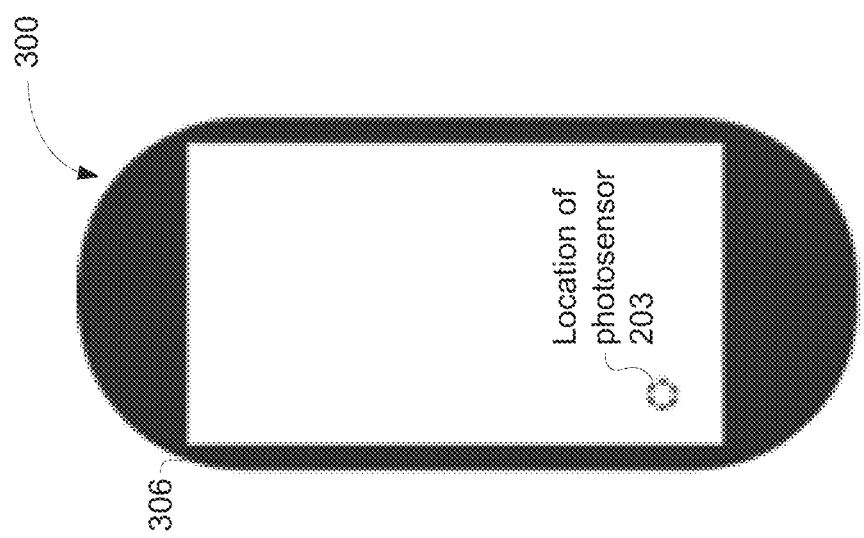
FIG. 3C depicts a top-down view of the wearable device of FIG. 3A.

FIG. 3C depicts a top-down view of the wearable device 300 of FIG. 3A. As can be seen in FIG. 3C, the cover glass 306 is the top layer of the wearable device 300. The location of photosensor 203 of the multi-functional ALS package 200 is also indicated in FIG. 3C, but it will be appreciated that a user of the wearable device 300 may not be able to discern based on looking at the wearable device 300.

FIG. 3D depicts a bottom-up view of internal components of the wearable device 300 of FIG. 3A. An example of an FPC 302 is shown as being behind a display 304, with a display driver 340 and a multi-functional ALS package 200 being mounted on the FPC 302. The FPC 302 further include a connector 370, which provides the main input and output for the display module. Inputs may include power and control signals for both the controller and display. Outputs may include outputs signals from the touch controller such as I2C, SPI, USB and or GPIO (General Purpose Input and Outputs) signals.

Figure 4A:
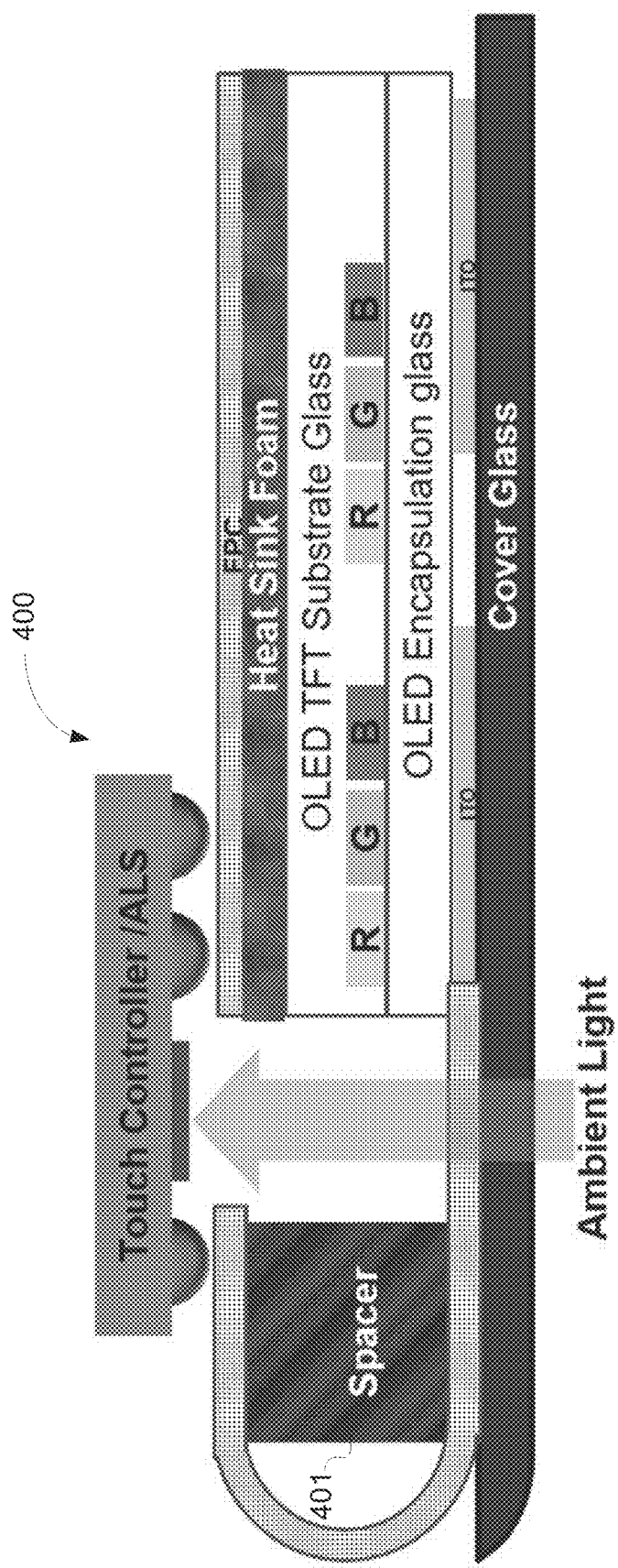
FIGS. 4A-4C depict another exemplary wearable device according to an exemplary embodiment.
Figure 4C:
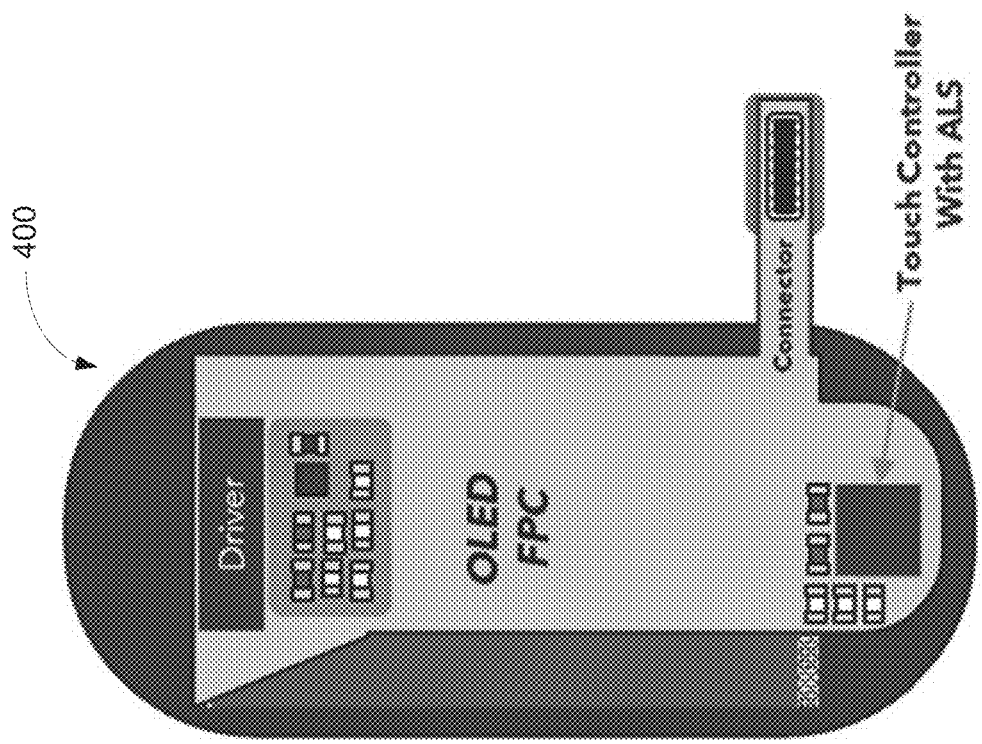
Figure 4B:

FIGS. 4A-4C depict another exemplary wearable device 400 according to an exemplary embodiment. Wearable device 400 includes components similar to that of wearable device 300, but wearable device 400 includes a multi-functional ALS package being mounted in a different position on an FPC such that the FOV of the ALS does not pass through the display of the wearable device 400. Instead, the FOV of the ALS passes through an aperture in the housing of the wearable device 400.

FIG. 4A depicts a cross-sectional view of the wearable device 400. As can be seen in FIG. 4A, ambient light passes through an aperture of the wearable device 400 (which includes a cutout in the FPC) without passing through the display of the wearable device 400. FIG. 4A further depicts a spacer 401 between the FPC and the cover glass in a position where the display does not overlap with the FPC and the cover glass.

FIG. 4B depicts a top-down view of the wearable device 400 of FIG. 4A. The location of an aperture 410 in the housing of the wearable device 400 is depicted in FIG. 4A. It will be appreciated that the aperture 410 may not be noticeable to a user of the wearable device 400.

FIG. 4C depicts a bottom-up view of internal components of the wearable device 400 of FIG. 4A. Similar to FIG. 3D, an example of an FPC is shown as at least partially being behind a display, with a display driver and a multi-functional ALS package being mounted on the FPC, and the FPC further include a connector.

Figure 5:
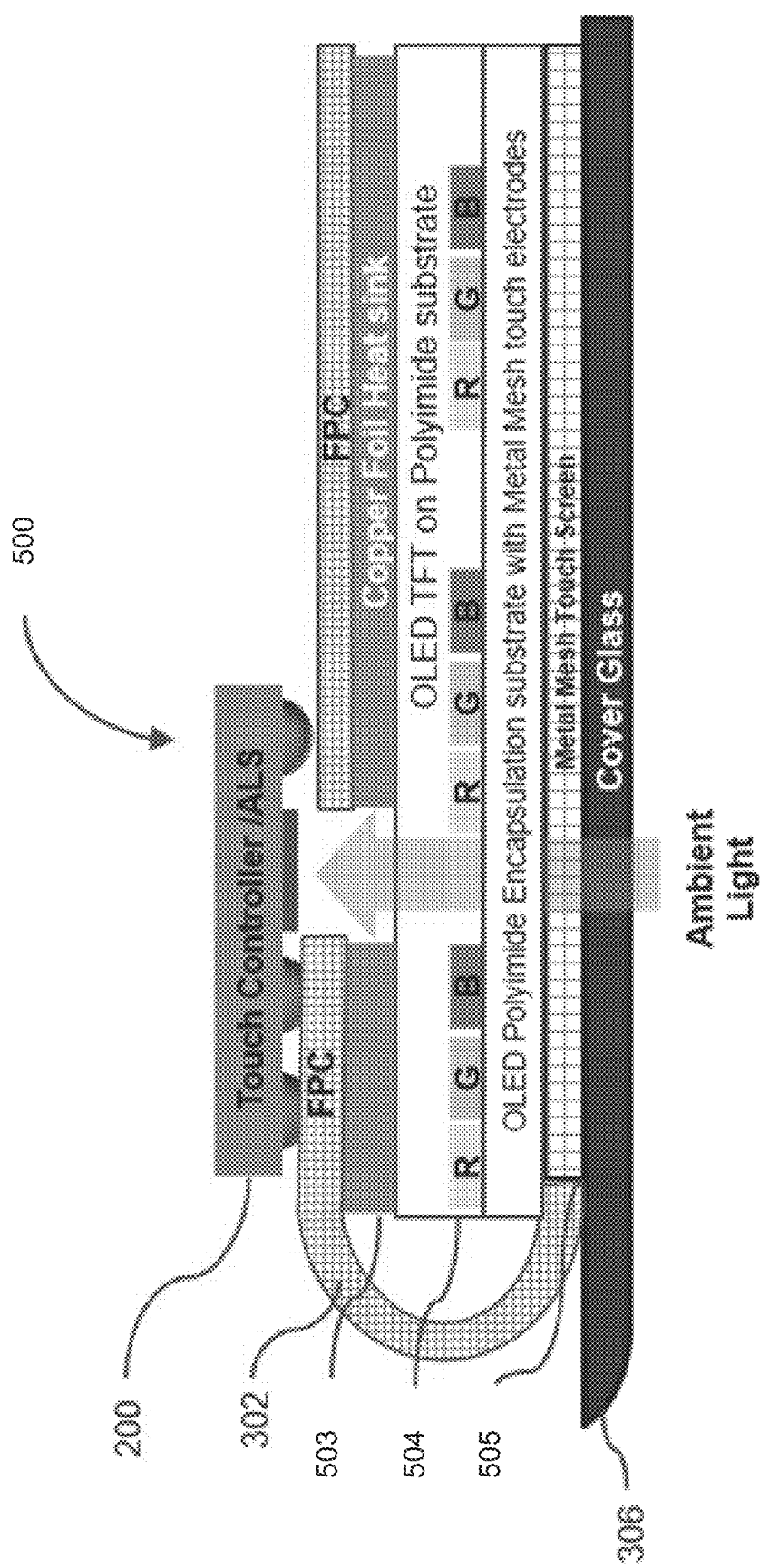
FIG. 5 depicts yet another exemplary wearable device according to an exemplary embodiment.

FIG. 5 depicts yet another exemplary wearable device 500 according to an exemplary embodiment. As discussed above, a flexible plastic-based substrate OLED (for example, as shown in FIG. 5) may be similar to a glass-based substrate OLED (for example, as shown in FIGS. 3A and 4A) with a few material differences. As shown in an exemplary wearable device 500, the device includes a copper foil heatsink layer 503, a flexible plastic-based OLED display 504 (which may be based on a polyimide plastic substrate), and a metal mesh touchscreen layer 505, while also including a multi-functional ALS package 200, FPC 302 and cover glass 306 (similar to multi-functional ALS package 200, FPC 302 and cover glass 306 discussed above in connection with FIG. 3A).

The exemplary embodiments depicted in FIGS. 2A-5 provide various advantages, for example, with regard to space-savings within applications which are constrained to a confined space, as well as with regard to cost. Touch-sensitive wearable devices (such as activity bands, smart watches, medical monitoring devices, smart clothing and wireless stereo earphones) are one example of a space-constrained and cost-sensitive application. For wearable devices and for other devices (e.g., devices which include a touch user interface, ambient light sensing functionality, and an OLED display), the above-discussed exemplary embodiments provide a tightly integrated and advantageous solution using integrated circuit (IC) packaging. Based on integrating the touch controller with the ALS in a WLCSP, space savings can be achieved for space-confined devices. Further, by utilizing a WLCSP for the ALS (as opposed to an ODFN or OLGA or other optical packaging), a lower-cost package is achieved, thereby also providing a lower overall bill-of-material (BOM) cost for device manufacturers.

Figure 6:
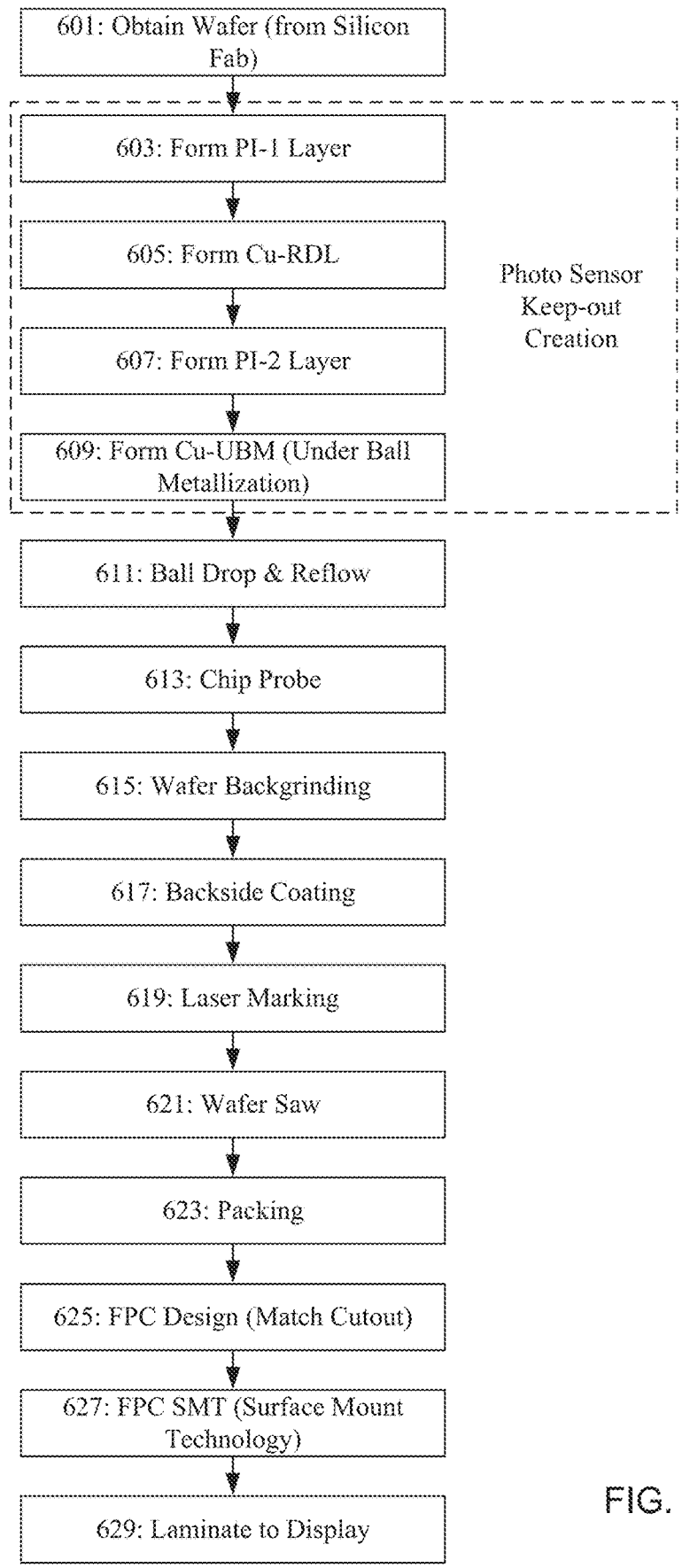
FIG. 6 depicts a flowchart illustrating the manufacturing flow for a WLCSP package.

FIG. 6 depicts an exemplary flowchart for forming the multi-functional ALS package 200 of FIGS. 2A-2C and the wearable devices 300, 400, 500 of FIGS. 3A-5. At stage 601, a wafer is obtained from a foundry. At stage 603, a first polyimide layer (PI-1) is formed. PI-1 may be a stress relief and protective insulating layer provided prior to the redistribution layer being formed, and it may have high thermal stability, chemical resistance and low flammability. At stage 605, a copper redistribution layer (RDL) is formed to interconnect the die to the board level. At stage 607, a second polyimide layer (PI-2) is formed to provide a dielectric layer between the RDL layer and an under ball metallization (UBM) layer. At stage 609, a copper UBM layer is formed for a chip-scale package (CSP) ball drop. Further, it will be appreciated that stages 603-609 correspond to photosensor keep-out creation, whereby based on stages 603-609, the WLCSP is formed in a manner which is able to accommodate an ALS in the manner shown in FIGS. 3A-5.

At stage 611, the ball drop and reflow is performed to form a CSP standoff. At stage 613, a wafer level chip probe test is performed. At stage 615, the wafer is backgrinded to a desired thickness for the package. At stage 617, the backside of the wafer is coated with a protection layer to protect the CSP silicon from cracking due to handling. At stage 619, laser marking is performed (e.g., with respect to a marking logo, date code, and/or product information). At stage 621, wafer sawing is performed to dice the package into singular units. At stage 623, the package is packed (e.g., tape & reel vacuum packaging) for an assembly vendor.

At stage 625, a flexible circuit board is designed such that the footprint on the FPC is in alignment with the CSP ball array (and the FPC may have a cutout as described above aligned with an ALS photosensor). At stage 627, the CSP is mounted on the FPC using surface mount soldering technology. At stage 629, the FPC module may then be laminated to a display.

It will be appreciated that the foregoing process described in connection with FIG. 6 is merely an example, and that other exemplary embodiments may omit certain steps, add certain steps, and/or modify certain steps. For example, in an exemplary embodiment, the process may include an additional step of forming an infrared optical cut-off filter over the photosensor for mimicking a human visual response.

Exemplary embodiments of the present disclosure utilize semiconductor devices as an advantageous platform for integration of multiple types of sensing technologies due to the unique material properties of semiconductors. For example, as discussed above, sensing technologies such as capacitance sensing, inductive sensing, and ambient light sensing may be integrated on a semiconductor platform. Further exemplary embodiments may further integrate other types of sensing, such as temperature sensing and magnetic field sensing. A Hall Effect sensor is one example of a device that can be used to for detecting the presence, strength and direction of a magnetic field produced from a permanent magnet or other magnetic field sources.

The exemplary embodiments discussed above in connection with FIGS. 2A-5 are applicable, for example, to touchscreen display devices, such as wearable devices and smartphones. It will be appreciated, however, that the principles discussed herein are also applicable in other situations, for example, with respect to laptops, tablets, and smartphones which utilize ALSs and/or closure detection. In the following embodiments discussed below in connection with FIGS. 7A-9, multi-functional ALS packages are discussed which have 3-in-1 functionality with respect to specific absorption rate (SAR) sensing (which is capacitive sensing for whether or not a human is proximate to a mobile device within FCC-mandated SAR requirements), ambient light sensing, and Hall sensing for closure detection (e.g., detecting whether a lid of a laptop is closed or detecting whether a tablet has been folded/covered). It will be appreciated that, although SAR sensing is different from touch sensing, a 3-in-1 multi-functional ALS package which performs SAR sensing, ambient light sensing, and Hall sensing may still be referred to as a touch controller with integrated ALS. It will further be appreciated that instead of Hall sensors, there are other ways to detect closure, such as through inductive sensing, Thus, a 3-in-1 multi-functional ALS package which performs SAR sensing, ambient light sensing, and closure sensing may be characterized as included a "closure sensor," wherein the closure sensor may be, for example, a Hall sensor or an inductive sensor.

FIG. 7A depicts a device functional level block diagram of a 3-in-1 multi-functional WLCSP touch controller having SAR sensing capabilities, ambient light sensing capabilities, and Hall sensing capabilities. The 3-in-1 multi-functional WLCSP touch controller is a multi-functional ALS package 700 with an ALS (photosensor 203) and a Hall sensor 707. The Hall sensor 707 may use the same AFE 204 as other components of the multi-functional ALS package for measuring a Hall effect voltage.

FIG. 7B depicts top and side views of the multi-functional ALS package depicted in FIG. 7A with WLCSP packaging. As illustrated in FIG. 7B, there are four Hall plates, wherein a respective Hall plate is placed in each corner of the die. It will be appreciated that the four Hall plates in FIG. 7B are exemplary, and a different number of Hall plates may be used in other exemplary implementations. The number of Hall plates used may depend on the intended application for the multi-functional ALS package (e.g., providing placement flexibility of the permanent magnets, linear displacement detection, rotational displacement detection, horizontal and/or vertical magnetic field detection).

FIG. 7C depicts an example of a 3-in-1 multi-functional OQFN touch controller having SAR sensing capabilities, ambient light sensing capabilities, and Hall sensing capabilities. The construction of the touch controller with the ALS on a semiconductor platform is similar to the embodiments described above, but instead of being packaged with RDL solder balls providing connections to an FPC, the packaging is OQFN packaging with optical QFN bond wires to a lead frame pad. It will be appreciated that in other exemplary embodiments, an ODFN or an OLGA package may be used instead of an OQFN package.

Figure 7D:
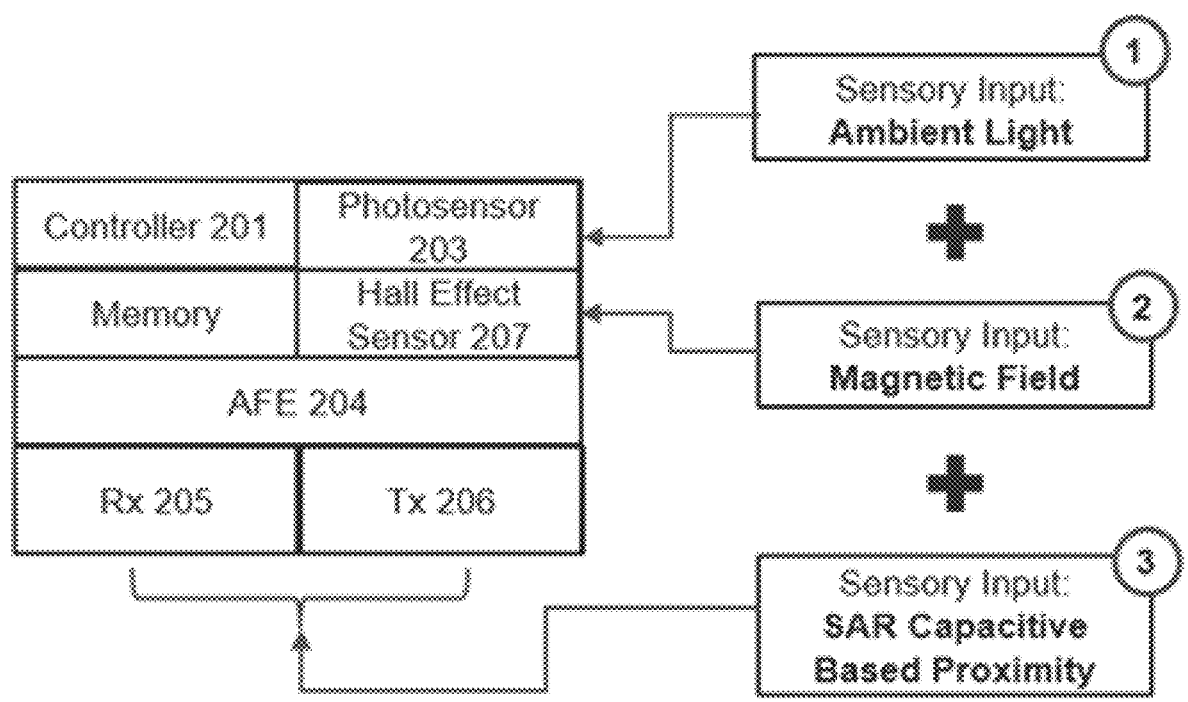
FIG. 7D depicts the device functional level block diagram of FIG. 7A with sensory inputs associated with certain respective elements thereof.

FIG. 7D depicts the device functional level block diagram of FIG. 7A with sensory inputs associated with certain respective elements thereof. As discussed above, the 3-in-1 multi-functional WLCSP touch controller has SAR sensing capabilities, ambient light sensing capabilities, and Hall sensing capabilities. The sensor input for ambient light sensing is based on ambient light, and the ambient light is detected by photosensor 203. The sensory input for closure detection is based on magnetic field strength, and the magnetic field strength is detected by Hall sensor 707. The sensory input for SAR proximity sensing is based on capacitance, and the capacitance is detected via Rx 205 and Tx 206.

Figure 8A:
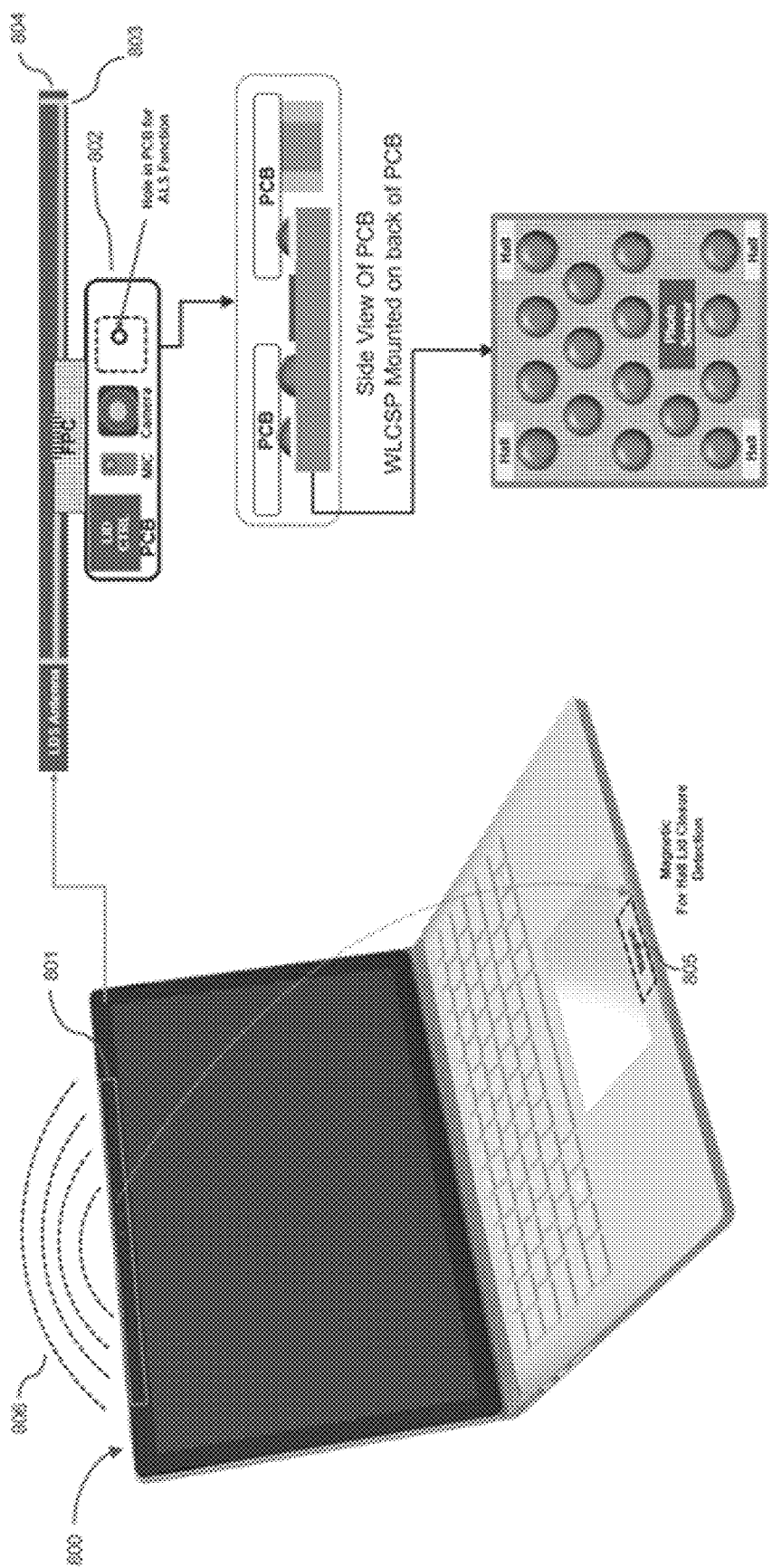
FIG. 8A depicts an example of a laptop having a 3-in-1 multi-functional WLCSP touch controller having SAR sensing capabilities, ambient light sensing capabilities, and Hall sensing capabilities.

FIG. 8A depicts an example of a laptop 800 having a 3-in-1 multi-functional WLCSP touch controller having SAR sensing capabilities, ambient light sensing capabilities, and Hall sensing capabilities. It will be appreciated that a laptop typically has capability to transmit wireless RF (radiofrequency) signals such as WiFi, Bluetooth and/or cellular (5G, 4G, LTE, GSM) through an antenna assembly 804. Wireless connectivity is typically subject to regulatory safety emissions requirements, such as the FCC SAR requirement of 1.6 W/kg from a distance of 0 mm to 10 mm to a human body. As shown in FIG. 8A, SAR proximity sensing may be used in a laptop for monitoring for the presence of a human body, and based on the SAR proximity sensing, the laptop may regulate the radiated RF power output 806 to be within the regulatory limits (e.g., 1.6 W/Kg). An antenna (such as a laser direct structuring (LDS) antenna, an FPC antenna, a PCB antenna, or a discrete wire antenna) of the laptop may be used as a capacitive sensor for performing SAR proximity sensing. The ambient light sensing functionality of the laptop may be used to regulate the brightness of the laptop display based on ambient light conditions. Additionally, the laptop may include a permanent magnet disposed on a bottom portion of the base of the laptop beneath a touchpad of the laptop, such that lid closure detection sensing may be performed using a Hall sensor (or an inductive sensor) in a corresponding top portion of the lid of the laptop. Since there is a limited amount of space available in the bezel around the display, and the space in the bezel may be used to accommodate various other components as well (such as microphone and camera and their corresponding circuit board(s)), it is advantageous to integrate SAR sensing capabilities, ambient light sensing capabilities, and Hall sensing capabilities into a single package (such as the WLCSP package depicted in FIG. 8A) disposed in the top portion of the lid of the laptop. The resultant integration of these multiple functions into a single chip package allows for laptop manufacturers to reduce the number of discrete components that need to be located inside the limited bezel area and may provide for advantageously reducing the size of the bezel.

The left side of FIG. 8A illustrates a perspective schematic view of an exemplary laptop 800. The laptop 800 includes a permanent magnet 805 in the bottom portion of the base below a touchpad of the laptop 800, and the laptop 800 radiates RF power output 806 during operation. The lid of the laptop contains a top portion 801 of the bezel around a display of the laptop, and as depicted in the top right portion of FIG. 8A, this top portion 801 includes an antenna assembly 804 (e.g., an LDS antenna assembly, an FPC antenna assembly, a PCB antenna assembly, or a discrete wire antenna assembly) with electrode 803 (which may be formed of silver ink, copper, and/or gold plating) which serves as a wireless antenna used for SAR proximity sensing, connected to a PCB 802 via an FPC. The PCB includes a lid controller (LID CTRL), a microphone, and a camera, as well as a multi-functional ALS package implemented as a WLCSP touch controller having an integrated ALS. The lid controller may be, for example, a microcontroller or a custom application-specific integrated circuit (ASIC) which provides for interface aggregation for various components located at the top of the lid of the laptop, such as various sensors and microphones. The lid controller may, for example, have various interfaces (such as I2C, SPI, and/or GPIO), and convert them into a single USB stream sent down through the laptop hinge to a main central processing unit (CPU) or sensor hub processor located on a main PCB of the laptop.

It will be appreciated that although FIG. 8A depicts all of these components as being disposed on a single PCB, in various implementations, the components may be disposed on one or more PCBs (for example, the camera and microphone may have their own PCB separate from the PCB to which the multi-functional ALS package is attached). As depicted in the middle right portion of FIG. 8A (which is a cross-sectional side view of the PCB and the WLCSP touch controller mounted on a back side of the PCB), the PCB includes an aperture to allow ambient light to pass through to the ALS of the WLCSP touch controller. As depicted in the bottom right portion of FIG. 8A (which is a bottom view of the WLCSP touch controller), the bottom side of the WLCSP touch controller includes a plurality of solder balls, a plurality of hall plates, and a photosensor.

Figure 8B:
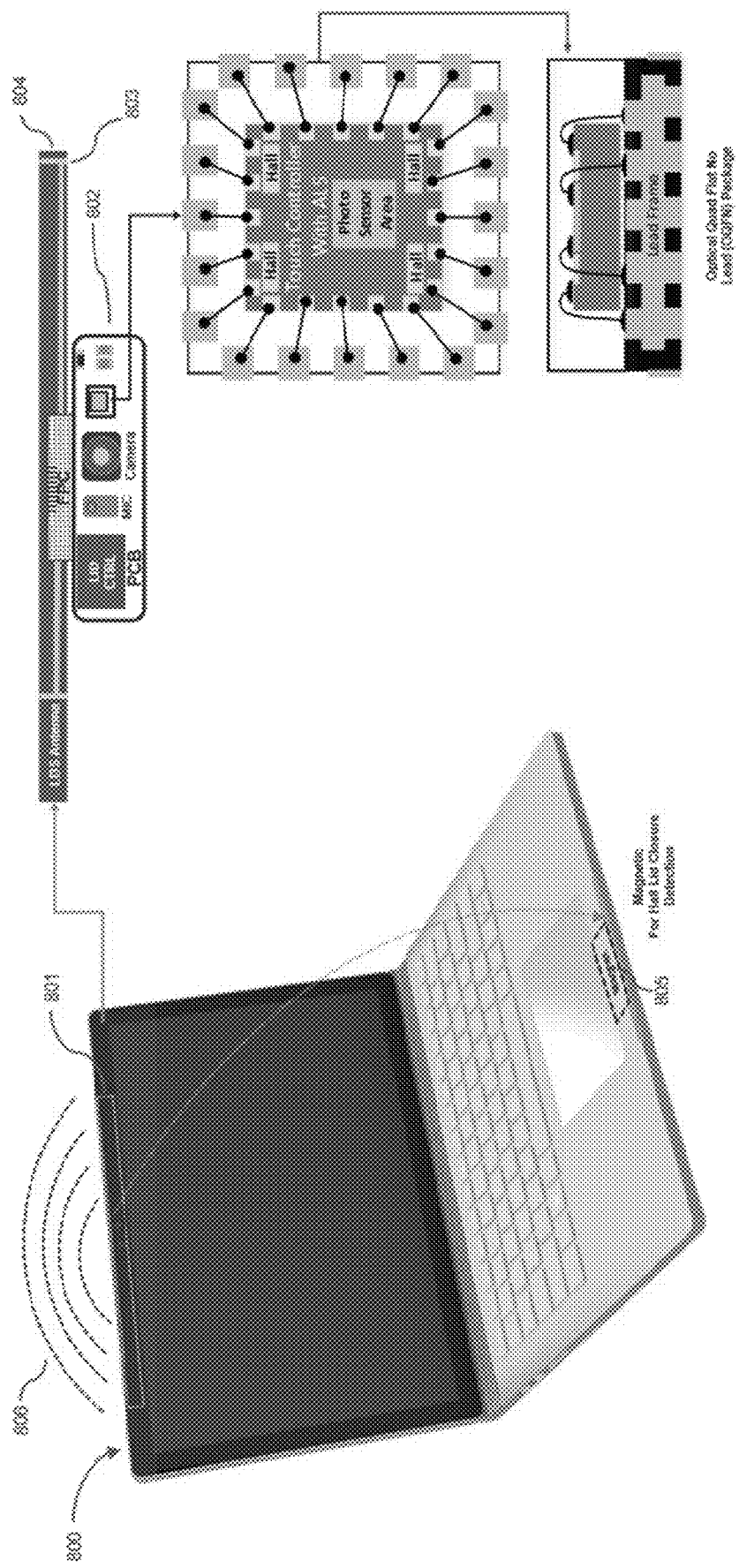
FIG. 8B depicts an example of a laptop having a 3-in-1 multi-functional OQFN touch controller having SAR sensing capabilities, ambient light sensing capabilities, and Hall sensing capabilities.

It will be appreciated that FIG. 8A shows an example of a laptop having the multi-functional ALS package depicted in FIG. 7B. FIG. 8B shows an example of a laptop having the multi-functional ALS package depicted in FIG. 7C, and it will be appreciated that the elements depicted in FIG. 8B are similar to those depicted in FIG. 8A, except that the multi-functional ALS package of FIG. 7B is replaced with the multi-functional ALS package of FIG. 7C, which is a 3-in-1 multi-functional OQFN touch controller having SAR sensing capabilities, ambient light sensing capabilities, and Hall sensing capabilities. As discussed above, it will be appreciated that in other exemplary embodiments, an ODFN or an OLGA package may be used instead of an OQFN package.

Figure 8C:
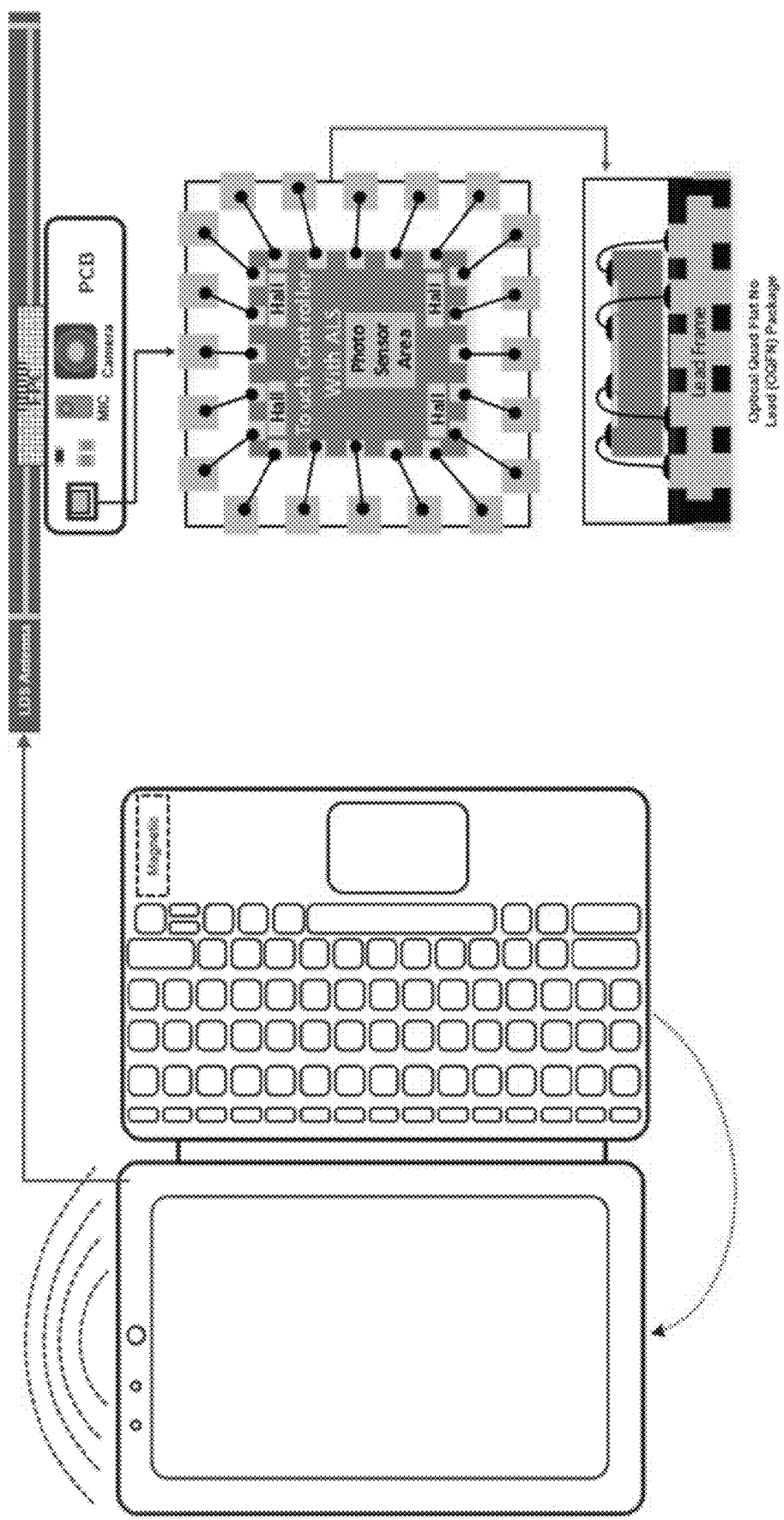
FIG. 8C depicts an example of a tablet (with accompanying keyboard) having a 3-in-1 multi-functional OQFN touch controller having SAR sensing capabilities, ambient light sensing capabilities, and Hall sensing capabilities.

It will further be appreciated that, although FIGS. 8A-8B depict multi-functional ALS packages in the context of a laptop environment, these multi-functional ALS packages may also be used in other device environments, such as tablets and smartphones which are also subject to SAR requirements. For example, FIG. 8C depicts an example of a tablet (with accompanying keyboard) having a 3-in-1 multi-functional OQFN touch controller having SAR sensing capabilities, ambient light sensing capabilities, and Hall sensing capabilities. It will be appreciated that the elements depicted in FIG. 8C are similar to those depicted in FIG. 8B, except that the multi-functional ALS package is implemented as part of a tablet instead of a laptop. The depicted keyboard has an accompanying keyboard which can be folded to cover the tablet, and the keyboard is implemented with a permanent magnetic for closure detection. In an alternative implementation, a cover without a keyboard may also be utilized in a similar manner.

Figure 9:
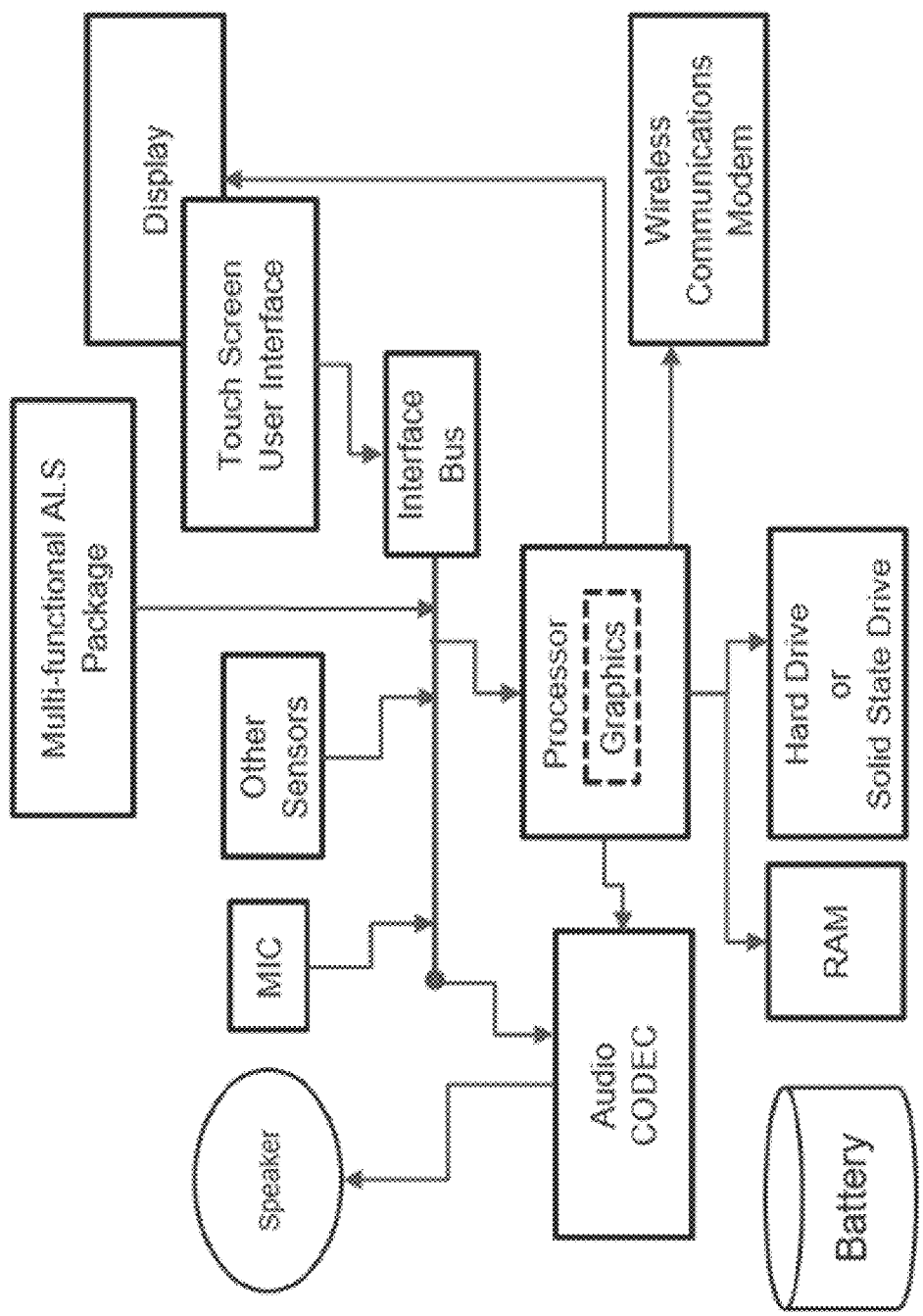
FIG. 9 is a block diagram showing a non-exhaustive set of exemplary components of a computing device.

FIG. 9 is a block diagram showing a non-exhaustive set of exemplary components of a computing device, such as the laptops and tablet depicted in FIGS. 8A-8C. The computing device includes one or more processors (including a graphics processor which may be integrated with a central processor or may be separate from the central processor), a wireless communications modem, audio codec(s), one or more memories (which may include, for example, random access memory (RAM), hard drives, and/or solid state drives), speaker(s), microphone(s), a touchscreen display, a battery, a multi-functional ALS package as described herein (which may include sensors such as an ALS and a Hall sensor), and various other sensors (which may include, for example, accelerometer(s), gyroscope(s), a magnetometer, and/or a temperature sensor). The computing device also includes appropriate interface buses for various components to communicate with one another, such as I2C, SPI, I3C and/or USB interfaces.

Figure 10:
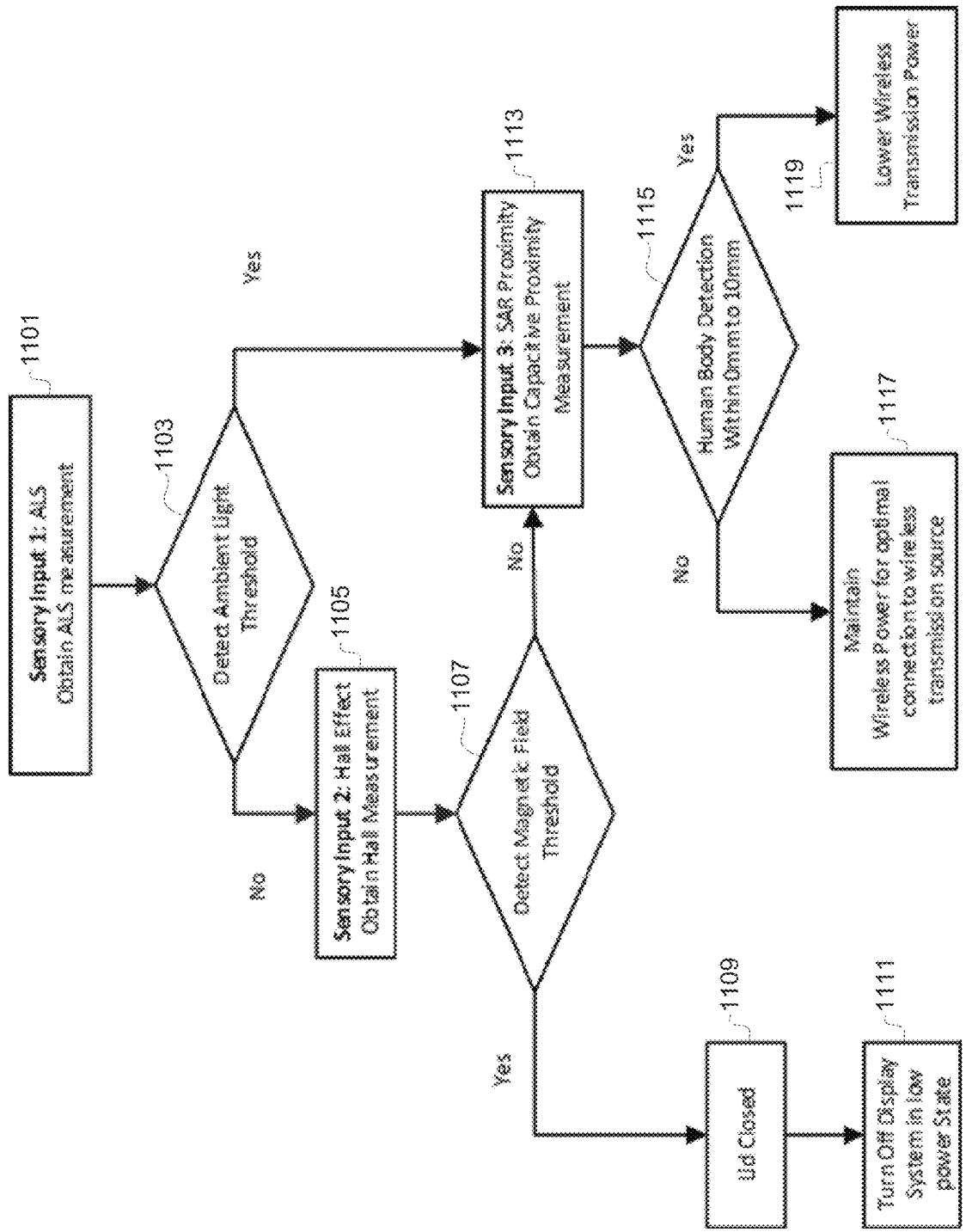
FIG. 10 is a flowchart depicting an exemplary process for utilizing a 3-in-1 multi-functional ALS package.

FIG. 10 is a flowchart depicting an exemplary process for utilizing a 3-in-1 multi-functional ALS package. At stage 1101, the ALS sensor of the multi-functional ALS package of a computing device is utilized to obtain an ALS measurement. It will be appreciated that ambient brightness levels may vary through variety of conditions—for example, in an office environment, the ambient brightness level may be in the range of 300 to 500 Lux, while for an outdoor environment on the order of 10,000 Lux or more. At stage 1103, based on a predetermined ambient light threshold level (which may be user-defined), the computing device may determine whether the computing device is in a closed position or an open position (e.g., if the computing device is a laptop, it may determine whether its lid is open or closed; if the computing device is a tablet or smartphone, it may determine whether the screen is covered; or if the computing device is a foldable smartphone, it may determine whether the foldable smartphone has been folded shut). Further, it will be appreciated that if the ambient light is detected as being above the threshold and the computing device is thus in the open position, the magnitude of the ALS measurement may be used for other purposes, such as to adjust a brightness of the display of the computing device.

At stage 1105, the computing device obtains a Hall effect measurement via a Hall sensor of the multi-functional ALS package, and at stage 1107, the computing device compares the obtained Hall effect measurement to a magnetic field threshold. If the Hall effect measurement exceeds the threshold, the computing device determines the computing device is in the closed state (stage 1109) and, based thereon, may further turn off its display and/or go into a low power state (stage 1111). On the other hand, if the Hall effect measurement does not exceed the threshold, the computing device determines the computing device is still open, and may, for example, remain in an active state and/or keep the display on.

As shown in FIG. 10, stage 1105 may be performed in response to an ALS measurement being below an ambient light threshold in order to corroborate whether the computing device is indeed in the closed position, as suggested by a low ambient light level. For example, there may be situations where the ALS measurement is low due to a user intentionally covering a camera (e.g., a webcam) of the computing device for privacy reasons, such that the ALS measurement indicates low light but the computing device is not actually closed. In other exemplary embodiments, the Hall sensor may be used on its own to determine whether or not the computing device is in the closed position (i.e., without needing to first perform stages 1101 and 1103).

In an example, when the computing device is in the closed position, the Hall sensor of the multi-functional ALS package may measure a magnetic field at or near magnetic field saturation levels on the order of 100 s of mT (milliTesla). Upon detection of low magnetic field (e.g., 10 s of mT or less) or no magnetic field being present, the computing device may determine that the computing device is in an open position therefore should be in an active state.

At stage 1113, the computing device obtains a capacitive SAR proximity measurement via an antenna, and at stage 1115, the computing device detects whether a human body is within 0-10 mm of the computing device based on the obtained capacitive SAR proximity measurement. If a human body is not present, the computing device maintains a normal wireless power for optimal connection to a wireless transmission source (stage 1117). On the other hand, if a human body is present, the computing device regulates its transmission power to be relatively lower so as to comply with SAR-related requirements (stage 1119).

As shown in FIG. 10, stage 1113 may be performed in response to an ALS measurement being above an ambient light threshold and further in response to the computing device verifying that it is not in the closed state based on a Hall effect measurement, such that SAR proximity sensing is only performed when the computing device is in an open state and not when it is in a closed state. In other exemplary embodiments, SAR proximity sensing is performed by the computing device both when the computing device is in the open state and also when it is in the closed state.

It will be appreciated that in accordance with exemplary embodiments of FIG. 10, the multi-functional ALS package may control the ALS sensing, the Hall sensing, and the SAR sensing to obtain the corresponding measurements, and another processor or processing system of the computing device (such as a central processing unit) may perform determinations and/or responsive operations based on the measurements (such as with respect to dimming or turning off the display, lowering transmission power, etc.). For example, the multi-functional ALS package may be a 3-in-1 chip which informs a main CPU as to the state of the three respective sensors associated with the 3-in-1 chip, and the main CPU may then control functions such as wireless transmission (e.g., power level and/or ON/OFF status) and/or display (e.g., brightness level and/or ON/OFF status) based thereon. It will be appreciated that in other exemplary embodiments, there may be different distributions of operations between one or more controllers of the multi-functional ALS package and one or more other processors of the computing device.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein. Variations of those exemplary embodiments may become apparent to those of ordinary skill in the art upon reading the foregoing description. It is understood that skilled artisans are able to employ such variations as appropriate, and the invention may be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A touchscreen display device, comprising:
   a multi-functional ambient light sensor package mounted on a flexible printed circuit coupled to touch sensing electrodes, wherein the multi-functional ambient light sensor package comprises:
     an ambient light sensor;
     transmitter and receiver circuitry coupled to the touch sensing electrodes via
       the flexible printed circuit; and
     a controller configured to obtain capacitance information from the touch sensing electrodes and ambient light information from the ambient light sensor via a single chip.

2. The touchscreen display device of claim 1, wherein the flexible printed circuit comprises a cutout.

3. The touchscreen display device of claim 2, wherein the ambient light sensor is configured to detect ambient light that has passed through the cutout.

4. The touchscreen display device of claim 1, comprising:
   a display, wherein the display comprises an aperture aligned with a cutout of the flexible printed circuit, and wherein the ambient light detected by the ambient light sensor passes through the aperture of the display before passing through the cutout of the flexible printed circuit.

5. The touchscreen display device of claim 4, wherein the display is offset from the cutout, and wherein the touchscreen display device further comprises a spacer offset from the display.

6. The touchscreen display device of claim 4, further comprising:
   heatsink material disposed between the display and the flexible printed circuit.

7. The touchscreen display device of claim 1, wherein the transmitter and receiver circuitry is further coupled to an inductor, and wherein the controller of the multi-functional ambient light sensor package is further configured to obtain inductance information for inductive sensing.

8. The touchscreen display device of claim 1, wherein the multi-functional ambient light sensor package is packaged as a wafer-level chip-scale package (WLCSP), an optical quad flat no-lead (OQFN) package, an optical dual flat no-lead (ODFN) package, or an optical land grid array (OLGA) package.

9. A computing device, comprising:
   a multi-functional ambient light sensor package mounted on a printed circuit board coupled to an antenna, wherein the multi-functional ambient light sensor package comprises:
     an ambient light sensor;
     a closure sensor; and
     a controller configured to obtain capacitance information from the antenna for specific absorption rate (SAR) proximity sensing, closure information from the closure sensor, and ambient light information from the ambient light sensor via a single chip.

10. The computing device of claim 9, wherein the multi-functional ambient light sensor package is packaged as a wafer-level chip-scale package (WLCSP), an optical quad flat no-lead (OQFN) package, an optical dual flat no-lead (ODFN) package, or an optical land grid array (OLGA) package.

11. The computing device of claim 9, wherein the printed circuit board comprises a cutout aligned with the ambient light sensor of the multi-functional ambient light sensor package, and wherein the ambient light sensor is configured to detect ambient light that has passed through the cutout.

12. The computing device of claim 9, wherein the antenna is a laser direct structuring (LDS) antenna, a flexible printed circuit (FPC) antenna, a printed circuit board (PCB) antenna, or a discrete wire antenna.

13. The computing device of claim 9, wherein the computing device is part of a laptop, and the antenna, the printed circuit board, and the multi-functional ambient light sensor package are disposed in a top area of a bezel of a lid of the laptop.

14. The computing device of claim 9, wherein the computing device is part of a tablet, and the antenna, the printed circuit board, and the multi-functional ambient light sensor package are disposed in a top area of a bezel of the tablet.

* * * * *